(12) United States Patent
Tamura

(10) Patent No.: US 6,283,130 B1
(45) Date of Patent: Sep. 4, 2001

(54) PLASMA CLEANING METHOD AND PLACEMENT AREA PROTECTOR USED IN THE METHOD

(75) Inventor: Takahiro Tamura, Tokyo (JP)

(73) Assignee: Anelva Corporation, Tokyo (JP)

( * ) Notice: Subject to any disclaimer, the term of this patent is extended or adjusted under 35 U.S.C. 154(b) by 0 days.

(21) Appl. No.: 09/374,112

(22) Filed: Aug. 16, 1999

Related U.S. Application Data

(63) Continuation-in-part of application No. 08/654,873, filed on May 29, 1996, now abandoned.

(30) Foreign Application Priority Data

May 30, 1995 (JP) .................................................... 7-156977

(51) Int. Cl.$^7$ ...................................................... B08B 7/00
(52) U.S. Cl. ............................................ 134/1.1; 134/22.1
(58) Field of Search .................................. 134/1, 1.1, 1.2, 134/1.3, 22.1, 22.18; 438/905; 156/345

(56) References Cited

U.S. PATENT DOCUMENTS

| | | |
|---|---|---|
| 4,340,456 | 7/1982 | Robinson et al. . |
| 4,350,578 | 9/1982 | Frieser et al. . |
| 4,528,438 | 7/1985 | Poulsen et al. . |
| 5,240,555 * | 8/1993 | Kilburm ............................... 134/1 X |
| 5,259,888 | 11/1993 | McCoy . |
| 5,269,881 | 12/1993 | Sekiya et al. . |
| 5,314,509 | 5/1994 | Kato et al. . |
| 5,346,578 | 9/1994 | Benzing et al. . |
| 5,514,246 | 5/1996 | Blalock . |
| 5,522,936 | 6/1996 | Tamura . |
| 5,602,061 | 2/1997 | Fujimaki . |

OTHER PUBLICATIONS

Grill, Cold Plasma in Materials Fabrication, IEEE Press, pp. 99–101 (1994).
English Language Abstract of Japanese Hei. 5–55184, 1993.
Pierson, Handbook of Chemical Vapor Deposition (DVD), Noyes Publications, pp. 231–234 and 278–282 (1992).
Dictionary of Science and Technology, W & R Chambers, pp. 495, 964, 1071 and 1254 (1974).
Hawkley's Chemical Dictionary, pp. 985, 986, 1035 (1993).
Sherman, Chemical Vapor Deposition for Microelectronics, Noyes Publication, pp. 66–77 and 131–136 (1987).

* cited by examiner

*Primary Examiner*—Alexander Markoff
(74) *Attorney, Agent, or Firm*—Sughrue, Mion, Zinn, Macpeak & Seas, PLLC

(57) ABSTRACT

In a vacuum processing system used in a semiconductor device manufacturing process, a plate-shaped placement area protector made of a dielectric material having a surface of dimensions and shape matching those of a surface of a substrate or an area for substrate placement in a surface of a substrate stage in place of the substrate. An etching gas is introduced into a vacuum vessel by a gas introduction mechanism and predetermined high-frequency electromagnetic wave power is applied to the substrate stage from a stage high-frequency electromagnetic wave power source. Plasma is formed in the proximity of the surface of the substrate stage by the applied high-frequency electromagnetic wave power, and a deposited film on the surface of the substrate stage is removed with the plasma. The placement area protector has the same electrical properties as the deposited film.

7 Claims, 4 Drawing Sheets ion of a plasma enhanced chemical vapor deposition system
PLASMA CLEANING METHOD AND PLACEMENT AREA PROTECTOR USED IN THE METHOD This is a Continuation-in-Part of application Ser. No. 08/654,873 filed May 29, 1996, now abandoned.

BACKGROUND OF THE INVENTION

1. Field of the Invention

This invention relates to an improvement in a plasma cleaning method for removing a thin film deposited on the inner face of a vacuum vessel and the surfaces of members in the vacuum vessel in a vacuum processing system such as a plasma enhanced chemical vapor deposition (PECVD) system used in a semiconductor device manufacturing process, for example.

2. Description of the Related Art

FIG. 5 is an illustration showing a schematic configuration of a plasma enhanced chemical vapor deposition system as an example of a conventional vacuum processing system.

The plasma enhanced chemical vapor deposition system shown in FIG. 5 consists mainly of a vacuum vessel 1 provided with an exhaust channel 11, a gas introduction mechanism 2 for introducing a predetermined gas into the vacuum vessel 1, a power supply mechanism 3 for energizing the introduced gas for forming plasma, and a substrate stage 4 for placing a substrate 40 on which a thin film is to be deposited.

The system in FIG. 5 carries the substrate 40 into the vacuum vessel 1 through a gate valve (not shown) and places the substrate 40 on the substrate stage 4. After evacuating the air in the vacuum vessel 1 through the exhaust channel 11, the system introduces a predetermined gas by the gas introduction mechanism 2. Next, the system applies energy of high-frequency electromagnetic wave power to the gas in the vacuum vessel 1 by the power supply mechanism 3 for forming plasma. Then, the system deposits a predetermined thin film on the surface of the substrate 40 by a vapor reaction enhanced by the plasma. For example, if monosilane gas and oxygen gas are introduced by the gas introduction mechanism 2, the plasma causes a decomposition reaction, and a silicon oxide thin film is deposited on the surface of the substrate 40.

When the thin film deposition is repeated in the plasma enhanced chemical vapor deposition system, a phenomenon occurs in which a silicon oxide thin film is also deposited on the surface of the substrate stage 4 exposed to the plasma and the inner face of the vacuum vessel 1. As the thin film is deposited on them, it will soon peel off due to the internal stress of the thin film, causing fine particulates to occur. If the fine particulates adhere to the silicon oxide thin film on the substrate 40, it causes a surface contamination to occur, degrading the commodity value of the silicon oxide thin film.

Such a problem occurs not only in the plasma enhanced chemical vapor deposition system, but also in a vacuum processing system such as a plasma etching system. That is, an etched material is deposited on the surface of a substrate stage and the inner wall of a vacuum vessel, depositing a thin film, which will peel off, causing fine particulates to occur, damaging circuitry on the substrate.

To suppress such a deposited film peeling, a plasma cleaning technique is generally used for etching and removing the unwanted deposited film before it peels off and contaminates a deposited thin film. In the technique, mixed gas of perfluorocarbon 14 gas (CF4):oxygen gas=80:20 or so is introduced into the vacuum vessel 1 by the gas introduction mechanism 2, plasma of the perfluorocarbon 14 gas and oxygen gas is generated, and the unwanted deposited film is etched and removed by the action of the plasma. That is, radial CFx (x=1, 2, or 3), CFx ions (x=1, 2, or 3), radial fluorine, or fluorine ions are generated in the plasma, and the fluorine radicals or ions react with the unwanted deposited film to yield volatile material, which is then discharged through the exhaust channel 11, thereby removing the thin film.

In the vacuum processing system in which the plasma cleaning is executed, the members are situated according to the concept that plasma is formed essentially for substrate processing. Thus, if the substrate stage is positioned such that it is exposed to too much plasma, damage to the substrate will result. Therefore, the substrate stage is located at a position considerably distant from the plasma forming place. In this case, when the plasma cleaning is executed, the plasma density in the vicinity of the surface of the substrate stage is unavoidably lowered. As a result, removal of the deposited film on the surface of the substrate stage requires a prolonged duration for plasma cleaning.

Particularly, in a thin film deposition system such as a plasma enhanced chemical vapor deposition system, a thin film is not deposited on the area covered with the substrate during the processing, which will be hereinafter referred to as the "placement area", on the surface of the substrate stage, but is deposited on an uncovered surface area, which will be hereinafter referred to as the "non-placement area". In recent years, various attempts have been made to enhance the film deposition rate. Such attempts result in not only high-rate film deposition on the substrate, but also deposition of a thick film on the non-placement area of the substrate stage.

Since only low-density plasma is exposed to the non-placement area of the substrate stage on which such a thick film is deposited, a serious problem of prolonging the plasma cleaning and lowering the availability of the system arises.

In plasma cleaning of the chamber, such as the inner face of the vacuum vessel, other than the substrate stage, the etch rate cannot sufficiently be increased and the plasma cleaning time period cannot be shortened.

SUMMARY OF THE INVENTION

It is therefore an object of the invention to enable short-time completion of plasma cleaning for removing a thin film deposited on the surface of a substrate stage in a vacuum vessel and so forth, to improve the availability of a system.

In attaining the above object, an aspect of the invention provides a plasma cleaning method comprising the steps of: placing a plate-shaped placement area protector made of a dielectric material having a surface of dimensions and shape matching those of a surface of a substrate to be processed or an area for substrate placement in a surface of a substrate stage, on the area for substrate placement so as to cover the area; introducing an etching gas into a vacuum vessel by a gas introduction mechanism; applying predetermined high-frequency electromagnetic wave power to the substrate stage from a stage high-frequency electromagnetic wave power supply so as to form plasma in the proximity of the surface of the substrate stage; and removing a film deposited on the surface of the substrate stage and an inner face of the vacuum vessel by using an etching action of the gas enhanced by the plasma.

Another aspect of the invention provides a plate-shaped placement area protector used in a plasma cleaning method comprising the steps of: placing the placement area protector on an area for substrate placement in a surface of a substrate stage in a vacuum vessel so as to cover the area; introducing an etching gas into the vacuum vessel; applying predetermined high-frequency electromagnetic wave power to the substrate stage so as to form plasma in the proximity of the surface of the substrate stage; and removing a film deposited on the surface of the substrate stage and an inner face of the vacuum vessel by using an etching action of the gas enhanced by the plasma, wherein the placement area protector is made of a dielectric material having a surface of dimensions and shape matching those of a surface of a substrate to be processed or the area for substrate placement.

DETAILED DESCRIPTION OF THE PREFERRED EMBODIMENT

Referring now to the accompanying drawings, there is shown a preferred embodiment of the invention.

Figure 1:
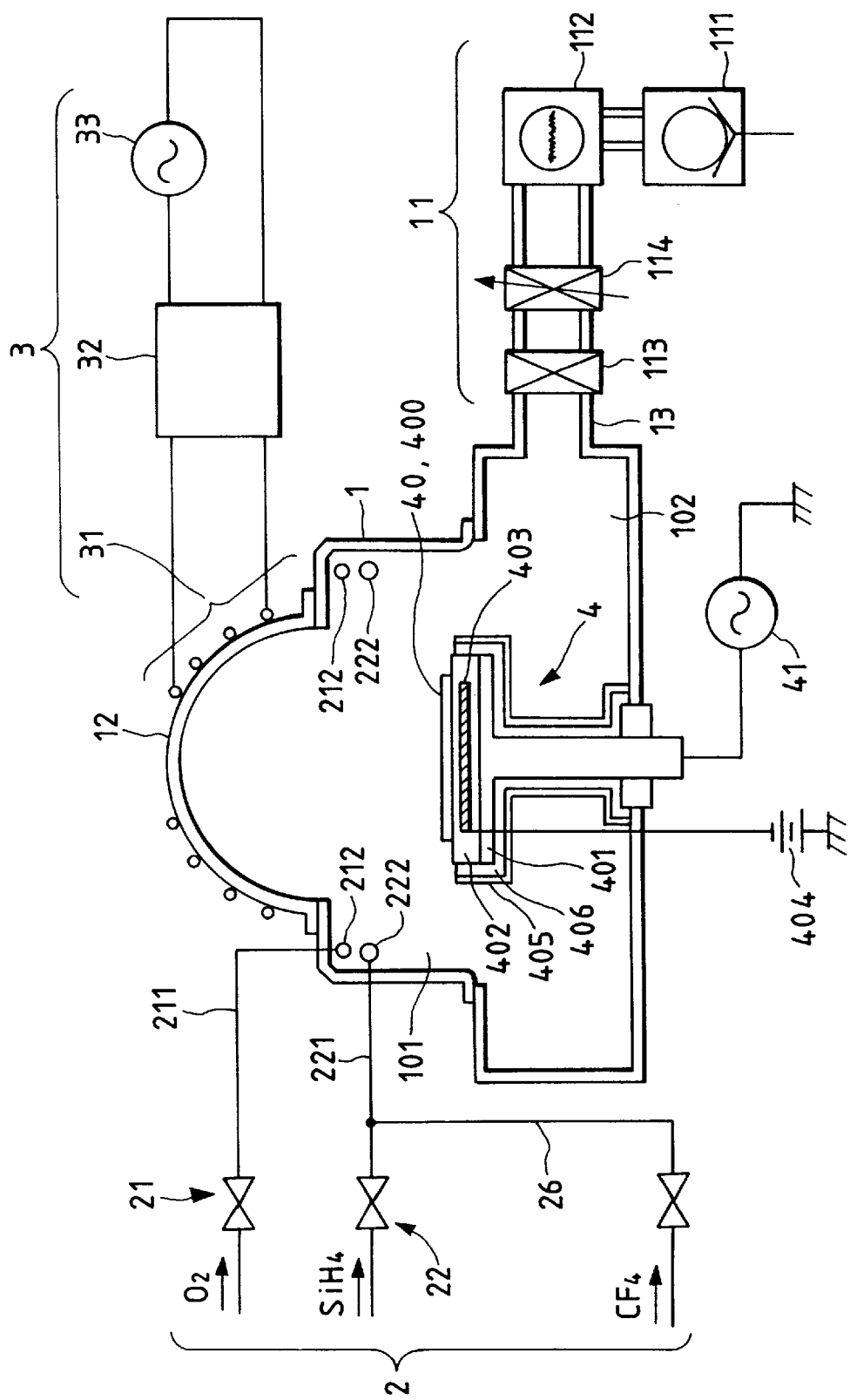
FIG. 1 is a schematic view showing a vacuum processing system wherein a plasma cleaning method according to an embodiment of the invention is executed.

FIG. 1 is a schematic view of a vacuum processing system wherein a plasma cleaning method according to an embodiment of the invention is executed; it shows a schematic configuration of a plasma enhanced chemical vapor deposition system as one example.

Figure 5:
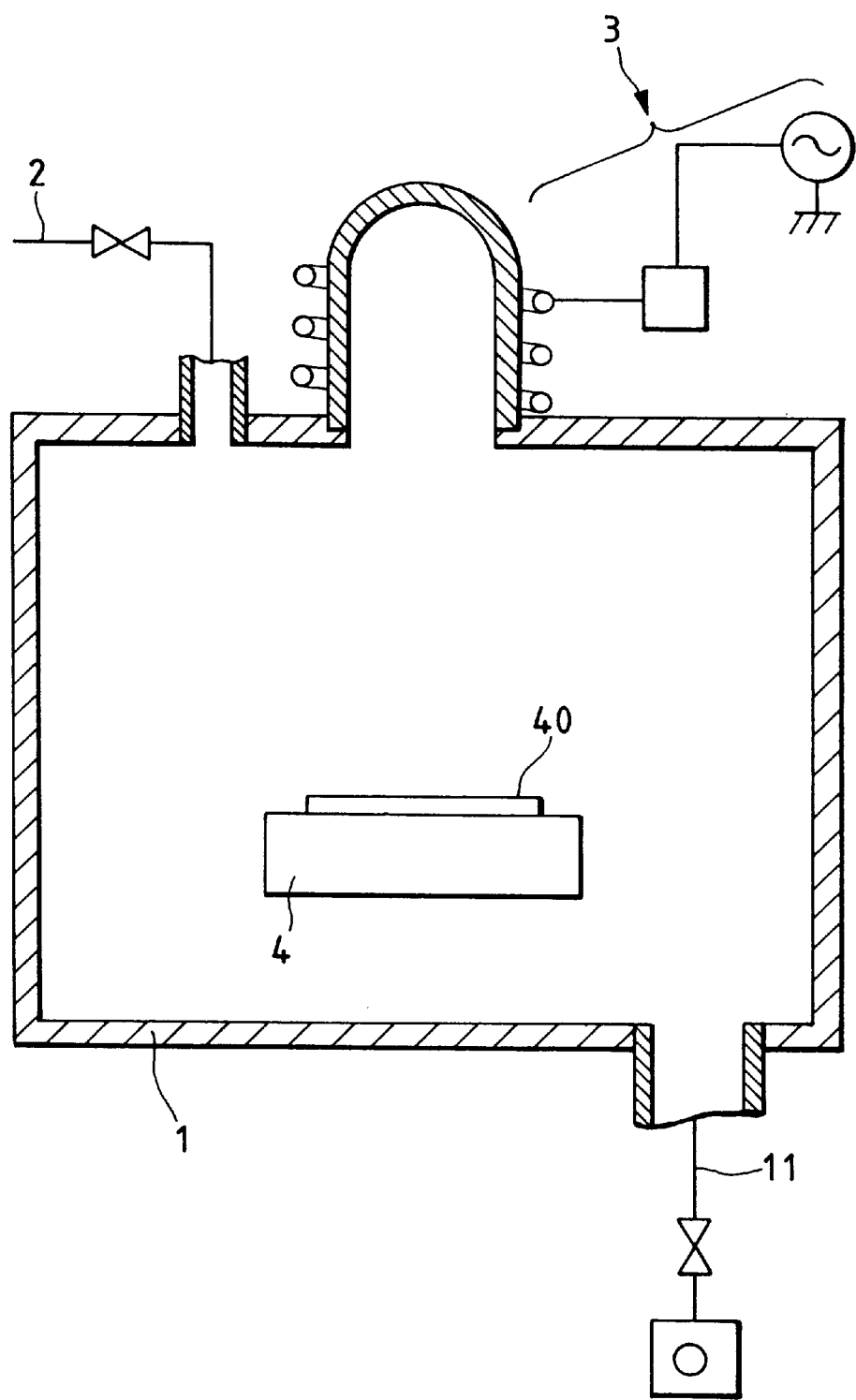
FIG. 5 is a view showing a schematic configuration of a plasma enhanced chemical vapor deposition system as an example of a conventional vacuum processing system.

Like the system shown in FIG. 5, the plasma enhanced chemical vapor deposition system shown in FIG. 1 comprises a vacuum vessel 1 provided with an exhaust channel 11, a gas introduction mechanism 2 for introducing a predetermined gas into the vacuum vessel 1, a power supply mechanism 3 for energizing the introduced gas for forming plasma, and a substrate stage 4 for placing a substrate on which a thin film is to be deposited. The system further comprises a stage high-frequency electromagnetic wave power supply 41 for applying predetermined high-frequency electromagnetic wave power to the substrate stage 4.

The vacuum vessel 1 comprises a film depositing chamber 101 and an air evacuating chamber 102 having a little large space positioned below the film depositing chamber 101. The part defining the film depositing chamber 101 and the part defining the air evacuating chamber 102 can be separated from each other for maintenance of the members in the vacuum vessel 1.

The container wall of the vacuum vessel 1 in the part of the film depositing chamber 101 is provided with a gate valve (not shown) and the container wall in the part of the air evacuating chamber 102 is provided with an exhaust pipe 13 to which the exhaust channel 11 is connected. The exhaust channel 11 consists mainly of a roughing vacuum pump 111, a main pump 112 placed at the stage preceding the roughing vacuum pump 111, and a main valve 113 and a variable conductance valve 114 disposed on an exhaust path for exhausting by the pumps 111 and 112.

The vacuum vessel 1 has a bell jar 12 on the top thereof. A circular opening is made at the center of the upper container wall of the vacuum vessel 1 and the bell jar 12 is connected to the opening in airtight relation. The bell jar 12 has a dome shape of about 200 mm in diameter and is made of a dielectric material such as silica glass.

In the example shown in FIG. 1, the gas introduction mechanism 2 comprises two gas introduction channels 21 and 22 so that it can introduce two different gases at the same time. The gas introduction channel 21 (22) consists mainly of piping 211 (221) connected to a tank (not shown) and a gas introduction body 212 (222) connected to the end portion of the piping 211 (221).

Figure 2:
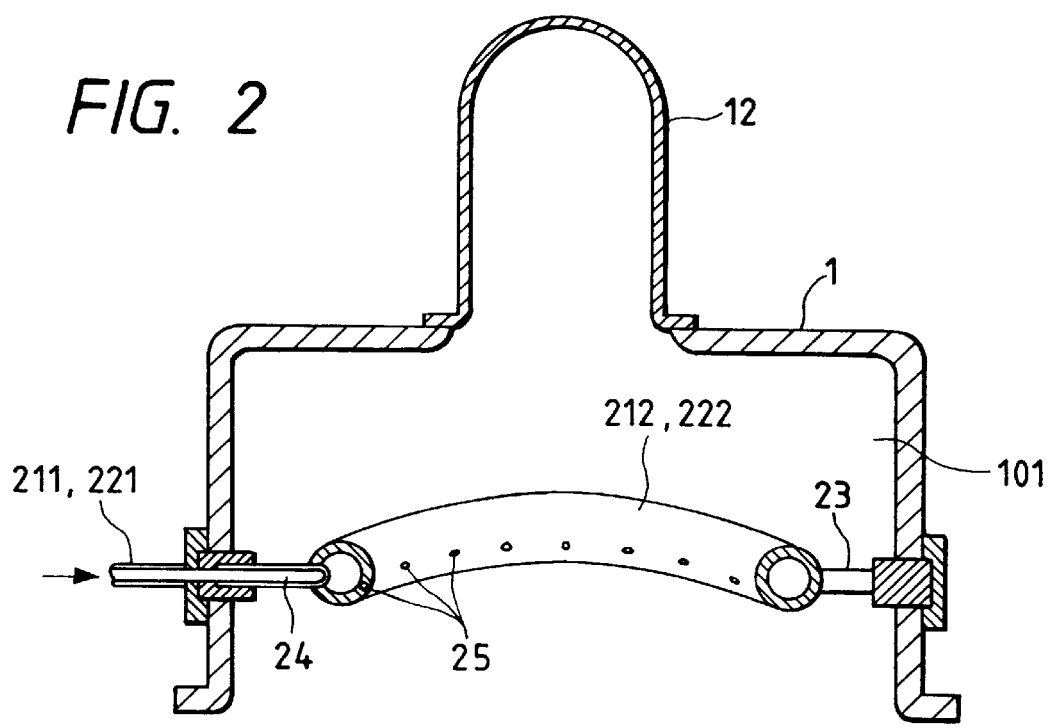
FIG. 2 is a view showing the structure of a gas introduction body in the system of FIG. 1.

FIG. 2 is a view showing the structure of the gas introduction body 212, 222. As shown in FIG. 2, the gas introduction body 212, 222 is made of an annular pipe having a circular cross section. It is supported by a support rod 23 disposed in the vacuum vessel 1 and is placed horizontally along the inner face of the vacuum vessel 1. The vacuum vessel 1 may be cylindrical or square-tubular.

Further, a transport pipe 24 is provided in a state in which it passes through the wall of the vacuum vessel 1 in airtight relation; it is connected at one end to the gas introduction body 212, 222 and at the other end to the piping 211, 221 in FIGS. 1 and 2.

As shown in FIG. 2, the gas introduction body 212, 222 has gas spouting holes 25 on the inner side face. The gas spouting holes 25 are openings each having about 0.5 mm in diameter and disposed on the peripheral surface at intervals of about 10 mm.

On the other hand, referring again to FIG. 1, the power supply mechanism 3 consists mainly of a high-frequency coil 31 disposed surrounding the bell jar 12, and a high-frequency electromagnetic wave power supply 33 for supplying high-frequency electromagnetic wave power via a matching box 32 to the high-frequency coils 31. For example, a device for generating high-frequency electromagnetic wave power of 13.56 MHz is adopted as the high-frequency electromagnetic wave power supply 33; the high-frequency electromagnetic wave power is supplied from the high-frequency coil 31 to the bell jar 12.

The substrate stage 4 is disposed below the bell jar 12 in the vacuum vessel 1. It is provided to place a substrate 40 to be processed on the surface thereof and consists mainly of a stage main body 401 made of metal and a chucking dielectric block 402 disposed on the top of the stage main body 401.

The substrate stage 4 adopts a mechanism for chucking the substrate 40 on the surface thereof by electrostatic chucking, and a chucking electrode 403 is embedded in the chucking dielectric block 402. A chucking power supply 404 is provided for giving a predetermined potential to the chucking electrode 403, whereby static electricity is produced on the surface of the dielectric block for chucking the substrate.

A shield plate 405 is disposed so as to cover the side faces of the substrate stage 4, and an insulation block 406 is placed between the shield plate 405 and the substrate stage 4. The shield plate 405 is provided to prevent plasma from turning and going to the sides of the substrate stage 4 and forming high-frequency discharge. It is formed of predetermined metal and is grounded.

As described above, the substrate stage 4 is provided with the stage high-frequency electromagnetic wave power supply 41 for applying predetermined high-frequency electromagnetic wave power. This stage high-frequency electromagnetic wave power supply 41 operates so as to apply a predetermined substrate bias voltage to the substrate 40 by the interaction between plasma and high frequency during the processing; it operates so as to form plasma in the proximity of the surface of the substrate stage 4 at the plasma cleaning time, as described below.

Next, the operation of the plasma enhanced chemical vapor deposition system will be discussed.

First, the substrate 40 is transferred into the vacuum vessel 1 through the gate valve (not shown) disposed in the vacuum vessel 1 and is placed on the substrate stage 4. The gate valve is closed and the exhaust channel 11 is operated for evacuating the vacuum vessel 1 to about 5 mTorr, for example.

Next, the gas introduction mechanism 2 is operated for introducing predetermined gases into the vacuum vessel 1 at a predetermined flow rate. At this time, the gases are supplied from the pipings 211 and 221 via the transport pipes 24 to the gas introduction bodies 212 and 222, and are spouted out and introduced into the vacuum vessel 1 through the gas spouting holes 25 of the gas introduction bodies 212 and 222. The introduced gases diffuse in the vacuum vessel 1 and reach the inside of the bell jar 12.

In this state, the power supply mechanism 3 is operated for applying about 13.56-MHz, 2000-W high-frequency electromagnetic wave power from the high-frequency electromagnetic wave power supply 33 via the matching box 32 to the high-frequency coil 31. At the same time, the stage high-frequency electromagnetic wave power supply 41 is also operated for applying a predetermined bias voltage to the substrate 40. This bias voltage is produced by the interaction between the high frequency given by the stage high-frequency electromagnetic wave power supply 41 and plasma.

The high-frequency electromagnetic wave power supplied by the power supply mechanism 3 is introduced into the bell jar 12 through the high-frequency coil 31 and energizes the gases existing in the bell jar 12 for producing plasma. The produced plasma diffuses downward from the bell jar 12 to the substrate 40. In the plasma, a predetermined product is produced, which then arrives at the substrate 40, whereby a predetermined thin film is deposited. At this time, the bias voltage generated by the stage high-frequency electromagnetic wave power supply 41 causes the ions in the plasma to be accelerated and collide with the substrate 40. Film deposition is efficiently executed by energy of the collision.

For example, during processing for depositing a silicon oxide thin film, a mono-silane gas is introduced through the first gas introduction channel 21 and an oxygen gas is introduced through the second gas introduction channel 22. Mono-silane is decomposed by mono-silane/oxygen plasma and reacts with oxygen to deposit a silicon oxide thin film.

In the system shown in FIG. 1, high-density plasma of $10^{10}$ cm$^{-3}$ or more can be produced in a region where the pressure in the film depositing chamber 101 is 100 mTorr or less, and a thin film can be deposited at a high film deposition rate with the high-density plasma.

As the thin film depositing process is repeated, a thin film is deposited on the inner face of the vacuum vessel 1, and the nonplacement area of the substrate stage 4. When the process has been repeated a considerable number of times, removal of the thin film is required and the following plasma cleaning is executed.

First, the processed substrate 40 is carried out, the gate valve (not shown) is closed, and the exhaust channel 11 is operated for once evacuating the vacuum vessel 1, then a placement area protector 400 is transferred into the vacuum vessel 1 through the gate valve and is placed on the substrate stage 4. That is, like the substrate 40, the placement area protector 400 is placed so as to cover the placement area otherwise covered with the substrate 40 placed thereon.

Next, the exhaust channel 11 is again operated for evacuating the vacuum vessel 1 to about 0.1 Torr. Then, the gas introduction mechanism 2 is operated for introducing perfluorocarbon 14 gas at a flow rate of 400 SCCM and oxygen gas at a flow rate of 100 SCCM into the vacuum vessel 1. To introduce the perfluorocarbon 14 gas, for example, a piping 26 of the perfluorocarbon 14 gas may be provided and connected to the piping 221 of mono-silane gas used for thin film deposition or the piping 211 of oxygen gas as plasma forming gas, and their valves may be switched selectively.

Then, the variable conductance valve 114 disposed in the exhaust channel 11 is controlled to maintain the pressure in the vacuum vessel 1 at about 2 Torr. In this state, the power supply mechanism 3 and the stage high-frequency electromagnetic wave power supply 41 are operated, whereby plasma is formed in the vacuum vessel 1. This differs from the processing of the substrate 40 in that supplementary plasma is also formed in the vicinity of the surface of the substrate stage 4 by the stage high-frequency electromagnetic wave power supply 41.

That is, high-frequency electromagnetic wave power applied by the stage high-frequency electromagnetic wave power supply 41 is introduced into the space in the proximity of the surface of the substrate stage 4 through the chucking dielectric block 402 of the substrate stage 4 and the placement area protector 400, and energizes gas existing in the space into plasma. On the other hand, the power supply mechanism 3 generates high-density plasma at a position considerably distant from the substrate stage 4 similarly to in the processing to the substrate 40.

Plasma is generated in such two places; it is formed efficiently in a wide space in the vacuum vessel 1. As a result, the unwanted deposited film on the inner wall of the vacuum vessel 1 and the non-placement area of the substrate stage 4 can be efficiently etched, thereby shortening the time period required for the plasma cleaning.

When gas was introduced, for example, under the conditions that high-frequency electromagnetic wave power given by the stage high-frequency electromagnetic wave power supply 41 was 1000 W at about 13.56 MHZ, that the power density resulting from dividing the power by the surface area of the placement area protector 400 was about 0.5 W/cm$^2$, and that high-frequency electromagnetic wave power given by the power supply mechanism 3 was 100 W at about 13.56 MHz, the plasma cleaning formerly taking about 60 minutes was completed in about 10 minutes.

Next, the placement area protector 400 used in the plasma cleaning method of the embodiment will be discussed.

As described above, the placement area protector 400 is placed on the substrate stage 4 in place of the substrate 40 when the plasma cleaning is executed. However, since the placement area protector 400 is limited to a dielectric material, it is not appropriate to call the placement area protector 400 "dummy substrate".

The reason why the placement area protector 400 is limited to a dielectric material is seen from the description given above; it is to efficiently transmit the high-frequency electromagnetic wave power given by the stage highfrequency electromagnetic wave power supply 41 to the space in the proximity of the surface of the substrate stage 4. As described above, the chucking dielectric block 402 is disposed on the top face of the stage main body 401 of the substrate stage 4, thus even if the placement area protector 400 is not placed, the surface of the substrate stage 4 is a dielectric material. Therefore, the highfrequency electromagnetic wave power can be introduced into the space in the proximity of the surface of the substrate stage 4.

However, if the plasma cleaning is executed without placing the placement area protector 400, the surface of the chucking dielectric block 402 is intensely etched; since no thin film is deposited during the processing of the substrate 40 on the surface of the placement area, namely, the area covered with the substrate 40 at the processing of the substrate 40 in the surface of the substrate stage 4, the area surface is exposed directly to the etching gas and is intensely etched when the plasma cleaning is executed.

If the surface of the chucking dielectric block 402 is etched, the etching does not uniformly develop, producing asperities on the surface. Resultantly, the electrostatic chucking action becomes nonuniform. In a severe case, the entire portion on the chucking electrode 403 may be etched to expose the chucking electrode 403, making electrostatic chucking impossible.

A thin film is deposited on the non-placement area in the surface of the substrate stage 4 during the processing, and is etched during the plasma cleaning, thus the surface of the substrate stage 4 below the thin film is not etched. If the cleaning operation continues after the thin film is completely removed, that portion may be etched, but will be etched less than the placement area; even if it is etched, originally the substrate 40 is not placed on that portion and therefore such a problem making it hard to electrostatically chuck the substrate 40 does not occur.

Considering such a point in the embodiment, the placement area protector 400 is placed on the substrate stage 4 in place of the substrate 40 for protecting the placement area of the substrate stage 4. Preferably, the placement area protector 400 is of such a shape to completely cover only the portion on which no thin film is deposited during the processing and not to cover the portion on which a thin film is deposited. If a part of the portion on which no thin film is deposited is not covered, the part is etched; if a part of the portion on which a thin film is deposited is covered, etching gas is shut off from the thin film of the part, which is not removed and is left.

Considering such a point in the embodiment, the placement area protector 400 is formed of a plate-shaped member made of a dielectric material and the dimensions and shape of the surface of the placement area protector 400 match those of the surface of the substrate 40 to be processed or those of the placement area of the surface of the substrate stage 4. Although the dimensions and shape of the placement area are often the same as those of the surface of the substrate 40, they may differ from each other if a space for transferring the substrate 40 exists, for example.

As seen from the description given above, the placement area protector 400 itself is etched during the plasma cleaning. Therefore, preferably it is made of such a material emitting substance which will be no foreign substance when the substrate 40 is processed; if the substrate 40 is made of a silicon-based semiconductor, the abovementioned silica glass is preferably used.

In a preferred embodiment, the placement area protector is formed from a material having the same electrical properties as the unnecessary deposited film which is formed in the vacuum vessel during substrate processing. As previously discussed, this unnecessary thin film becomes deposited on the inner surfaces of the vacuum vessel and on the surface of the substrate stage.

Further, it is preferable that the placement area protector 400 is transferred into and out of the vacuum vessel 1 by the same transport mechanism as that transferring the substrate 40, from the point of simplification of the system and the operation. In this case, if the placement area protector 400 is remarkably heavier than the substrate 40, it often exceeds the allowance of the transport mechanism. From this point, preferably the placement area protector 400 is ten times or less as heavy as the substrate 40.

To introduce the placement area protector 400, preferably it is transported through an opening such as the gate valve like the substrate 40. However, if the placement area protector 400 is too thick, it cannot be passed through the opening. In this case, such a troublesome operation of restoring the inside of the vacuum vessel 1 to atmospheric pressure, dividing the vacuum vessel 1, and placing the placement area protector 400 on the substrate stage 4 is required. From this point, preferably the placement area protector 400 is three times or less as thick as the substrate 40.

An example of the placement area protector 400 made of the above-mentioned silica glass is about 1.5 mm thick and has the surface dimensions and shape equal to those of a 6-inch wafer.

Next, pressure when the plasma cleaning method of the embodiment is executed will be discussed.

Figure 3:
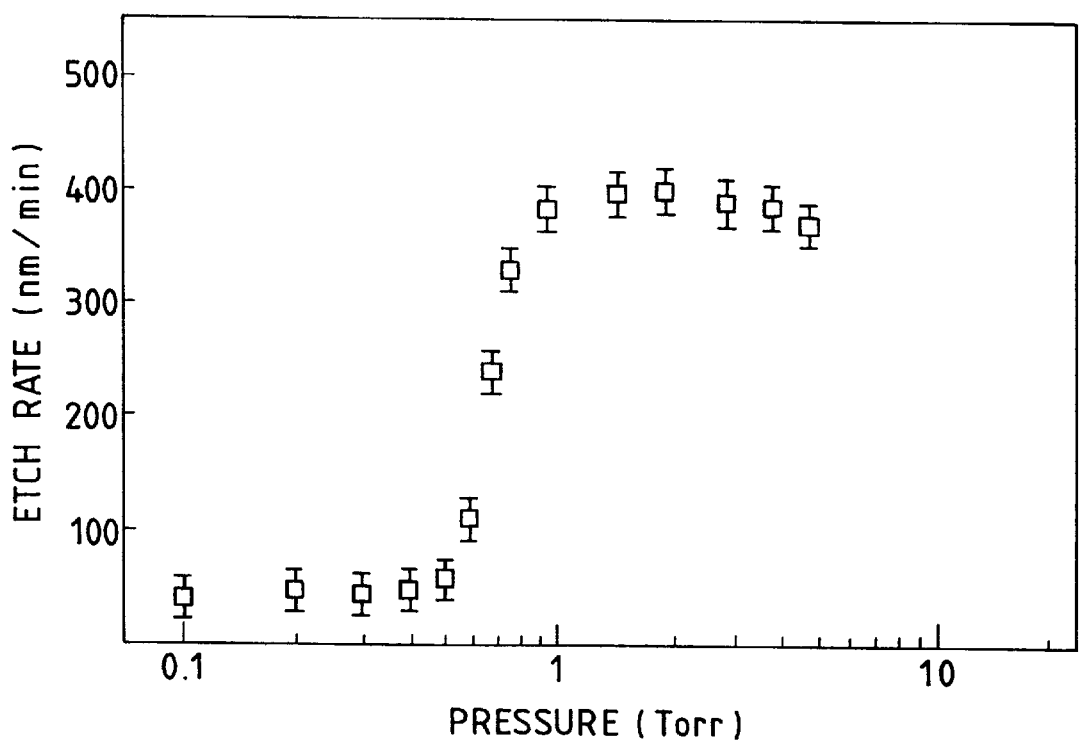
FIG. 3 is a graph showing the results of an experiment testing the pressure when the plasma cleaning method of the embodiment is executed.

FIG. 3 is a graph showing the results of an experiment testing the pressure when the plasma cleaning method of the embodiment is executed; it is a graph showing the relationship between the pressure in the vacuum vessel 1 and the etch rate of a silicon oxide film on the inner face of the vacuum vessel 1. In FIG. 3, the vertical axis denotes the etch rate and the horizontal axis denotes the pressure in the film depositing chamber 101.

The experiment conditions for FIG. 3 were perfluorocarbon 14 gas flow rate 400 SCCM, oxygen gas flow rate 100 SCCM, high-frequency electromagnetic wave power supplied to the bell jar 12, 2000 W, and high-frequency electromagnetic wave power applied to the substrate 40, 0.5 W/cm². The opening of the variable conductance valve 114 was adjusted and the number of revolutions of the main pump 112, which is a turbo molecular pump, was adjusted for evacuating the vacuum vessel 1, thereby changing the pressure in the vacuum vessel 1 from 0.1 Torr to 5 Torr.

As shown in FIG. 3, the etch rate is about 50 nm/min in the range where the pressure in the vacuum vessel 1 varies from 0.1 to 0.5 Torr, but increases as the pressure exceeds 0.5 Torr, and takes the maximum value of 400 nm/min when the pressure is about 2 Torr. The etch rate slightly decreases in the range where the pressure furthermore increases. In the range where the pressure exceeds 5 Torr, plasma discharge becomes unstable and sometimes plasma cannot be generated.

Thus, it is decided that the pressure region appropriate for plasma cleaning where the etch rate is high ranges from 0.5 to 5 Torr.

Figure 4:
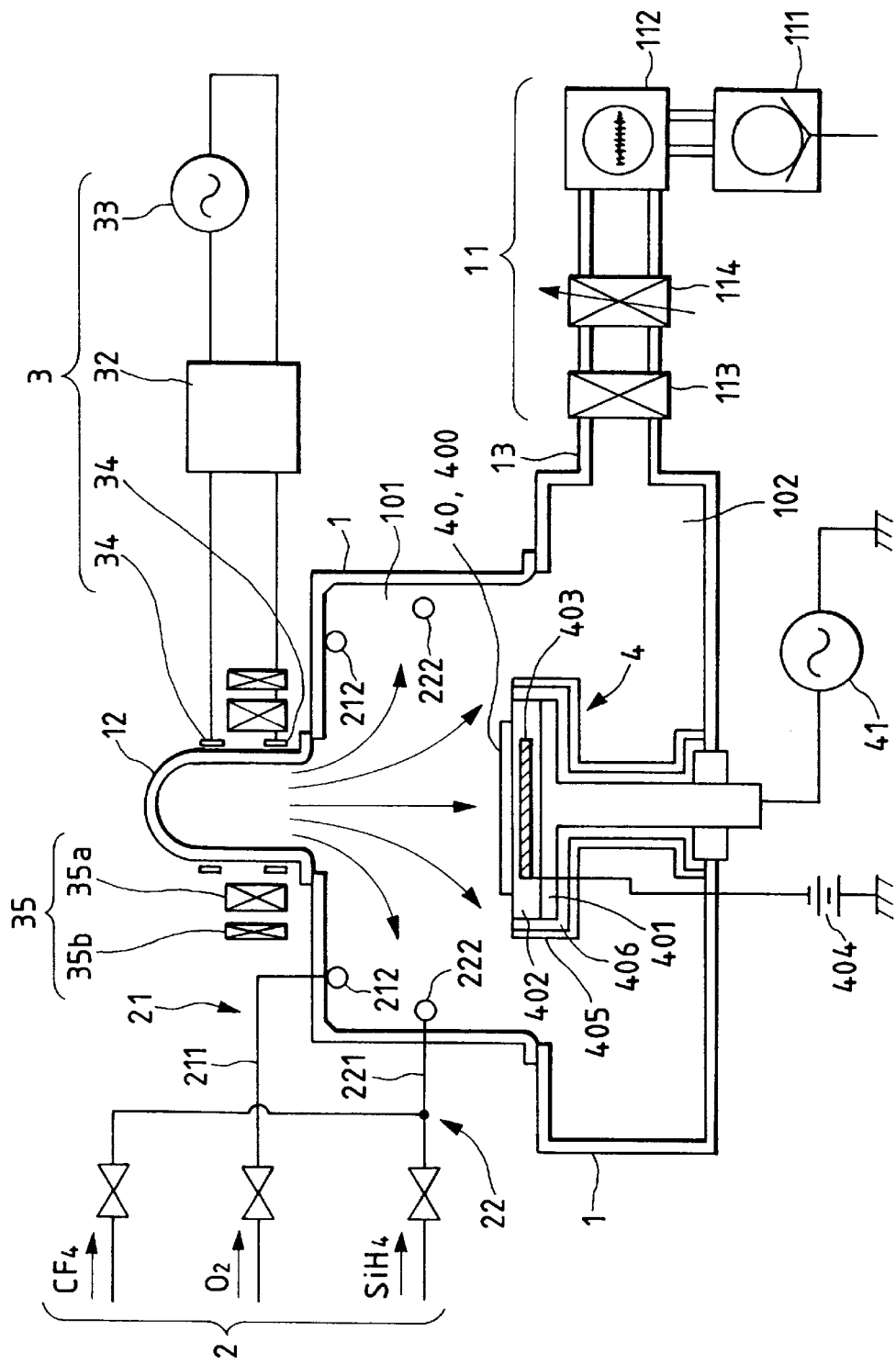
FIG. 4 is a view showing a schematic configuration of another system wherein the plasma cleaning method of the embodiment is executed.

A helicon wave plasma forming system may also be selected as a system wherein the plasma cleaning method is executed. FIG. 4 shows a schematic configuration of such a system.

For the helicon wave plasma, the fact that when a strong magnetic field is applied, an electromagnetic wave having a lower frequency than the plasma vibration frequency propagates in plasma without attenuation is used. Recently, attention has been given to the helicon wave plasma as a technique capable of producing high-density plasma at low pressure. When the electromagnetic wave propagation direction in the plasma is parallel with the magnetic field direction, the electromagnetic wave becomes circularly polarized light in one determined direction and proceeds helicoidally, which is why the technique is called helicon wave plasma.

The helicon wave plasma forming system in FIG. 4 has a loop-shaped antenna 34 disposed in place of the high-frequency coil 31 in FIG. 1. A round bar or a belt-shaped member is bent to form an upper and lower 2-stage loop-shaped as the antenna 34.

A magnetic field forming mechanism 35 is located surrounding a bell jar 12. It has a double coil structure consisting of an inner coil 35a and an outer coil 35b, which are disposed at positions coaxial with the bell jar 12. The coil winding direction and electrical energization direction of the inner coil 35a and the outer coil 35b are adjusted so that magnetic fields opposite to each other are formed. The magnetic field forming mechanism 35, which is made a double coil structure, has an advantage of easily producing a desired magnetic field. Further, it may be made of a single coil.

The magnetic field generated by the magnetic field forming mechanism 35 efficiently transports plasma produced in the bell jar 12 to a film depositing chamber 101, 50 that the production of the plasma into high density in the film depositing chamber 101 can be accelerated. As a result, the plasma cleaning for the inner face of a vacuum vessel 1 and the surface of a substrate stage 4 can also be executed more efficiently.

The plasma cleaning method of the invention is effective not only for the plasma enhanced chemical vapor deposition system, but also for other vacuum processing systems such as a substrate dry etching system.

Although the example of using perfluorocarbon 14 gas (CF$_4$) as etching gas has been discussed, it is clear that a similar effect is produced by using perfluorocarbon 116 gas (C$_2$F$_6$), sulfur hexafluoride gas (SF$_6$), nitrogen trifluoride (NF$_3$), mixed gas of argon gas with oxygen gas, or the like. If argon gas is used, plasma cleaning can be executed while highly efficient sputtering is performed because argon ions produced in plasma are high in sputtering ratio.

The placement area protector 400 may be formed of a material such as aluminum oxide or sapphire as well as silicon oxide or silica glass. In a preferred embodiment, the placement area protector has the same electrical properties as an unnecessary film which is deposited on surfaces located within the vacuum vessel during substrate processing.

As described above, according to the invention, the plasma cleaning for removing a thin film deposited on the surface of the substrate stage or the like in the vacuum vessel can be completed in a short time, contributing to improvement in the availability of the system.

What is claimed is:
1. A plasma cleaning method comprising the steps of:

placing a plate-shaped placement area protector on a substrate stage over an area corresponding to an area for a substrate placement during film formation to protect the area, said placement area protector being made of a dielectric material and having surface dimensions and a shape matching one of: (a) surface dimensions and a shape of a substrate to be processed during film formation and (b) an area for substrate placement on a surface of the substrate stage;

introducing an etching gas into a vacuum vessel by a gas introduction mechanism;

applying a first high-frequency electromagnetic wave to a conductor surrounding the vacuum vessel using a first high-frequency electromagnetic wave supply to form plasma in the vacuum vessel;

applying a second high-frequency electromagnetic wave to the substrate stage using a second high-frequency electromagnetic wave supply to supplementarily form plasma in the proximity of the surface of the substrate stage, wherein a frequency of said first high frequency electromagnetic wave and a frequency of said second high-frequency electromagnetic wave are equal.

2. The plasma cleaning method as claimed in claim 1, wherein pressure of the introduced etching gas ranges from 0.5 to 5 Torr.

3. The plasma cleaning method as claimed in claim 1 wherein in said area protector placing step, a planar surface of said placement area protector is placed on the substrate stage, the substrate stage having a major planar surface which is substantially free of indentations and protrusions.

4. The plasma cleaning method as claimed in claim 1, wherein the first high frequency electromagnetic wave applied to the conductor surrounding the vacuum vessel is applied simultaneously with the second high frequency electromagnetic wave applied to the substrate stage.

5. The plasma cleaning method as claimed in claim 1, wherein in said area protector placing step, the substrate to be processed during film formation is not placed on the substrate stage with the area protector.

6. The plasma cleaning method of claim 4 wherein the conductor surrounding the vacuum vessel is disposed external to the vacuum vessel.

7. The plasma cleaning method as claimed in claim 1, wherein said placement area protector is made from one of silicon oxide, sapphire and aluminum oxide, and the etching gas comprises oxygen and one of perflurocarbon, argon, sulfur hexfluoride and nitrogen trifluoride.

* * * * *